(12) United States Patent
Betak et al.

(10) Patent No.: US 11,735,914 B2
(45) Date of Patent: *Aug. 22, 2023

(54) METHODS FOR ELECTRICAL POWER-TRANSFER SYSTEMS

(71) Applicant: GoPlug Inc., Fremont, CA (US)

(72) Inventors: George Betak, Los Angeles, CA (US); Donald J. Christian, Fremont, CA (US); John J. Matranga, Moraga, CA (US)

(73) Assignee: GoPlug Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/512,218

(22) Filed: Oct. 27, 2021

(65) Prior Publication Data

US 2022/0052526 A1 Feb. 17, 2022

Related U.S. Application Data

(63) Continuation of application No. 17/319,945, filed on May 13, 2021, now Pat. No. 11,190,014.

(60) Provisional application No. 63/024,659, filed on May 14, 2020.

(51) Int. Cl.
*H02J 3/00* (2006.01)
*H02J 13/00* (2006.01)
*G05B 9/02* (2006.01)

(52) U.S. Cl.
CPC .............. *H02J 3/0012* (2020.01); *G05B 9/02* (2013.01); *H02J 13/00002* (2020.01)

(58) Field of Classification Search
CPC .... H02J 3/0012; H02J 13/00002; G05B 9/02; G01R 27/16; Y02E 60/00; Y04S 10/30
See application file for complete search history.

(56) References Cited

U.S. PATENT DOCUMENTS

| | | | | |
|---|---|---|---|---|
| 8,918,639 B2* | 12/2014 | Phatak | ..................... | G06F 21/40 |
| | | | | 713/156 |
| 10,916,940 B2* | 2/2021 | Donahue | ................. | H02J 3/001 |
| 11,190,014 B1* | 11/2021 | Betak | ..................... | H02J 3/0012 |
| 11,350,932 B2* | 6/2022 | Shelton, IV | ........... | G16H 20/40 |
| 11,545,852 B1* | 1/2023 | Caruso | ................. | H04L 41/145 |
| 2008/0077336 A1* | 3/2008 | Fernandes | ......... | H02J 13/00006 |
| | | | | 702/65 |
| 2010/0076615 A1* | 3/2010 | Daniel | ..................... | G05F 1/66 |
| | | | | 703/2 |

(Continued)

OTHER PUBLICATIONS

Notice of Allowance and Fees Due (PTOL-85) dated Jul. 29, 2021 for U.S. Appl. No. 17/319,945.

*Primary Examiner* — Ramesh B Patel

(74) *Attorney, Agent, or Firm* — Robert Moll; Kaplan Breyer Schwarz LLP

(57) ABSTRACT

An apparatus and methods are disclosed for monitoring the operation of an electrical power-transfer system and detecting and handling hazardous and undesirable system states. In accordance with one embodiment, an electrical signal is injected into the electrical power-transfer system. During or after the injection of the electrical signal, an electrical property between a first sensor and a second sensor are measured to obtain a measurement. The electrical power-transfer system is determined to be in a hazardous state based on the measurement, and in response to the determination one or more actions are performed to correct the hazardous state.

21 Claims, 9 Drawing Sheets

(56) References Cited

U.S. PATENT DOCUMENTS

| | | | |
|---|---|---|---|
| 2016/0141879 A1* | 5/2016 | Motsenbocker | G05F 1/67 |
| | | | 307/130 |
| 2017/0227596 A1* | 8/2017 | Sozer | E04H 12/00 |
| 2017/0250550 A1* | 8/2017 | Miftakhov | H02J 3/007 |
| 2018/0041072 A1* | 2/2018 | Clifton | H02J 15/00 |
| 2019/0341783 A1* | 11/2019 | Kosugi | H02J 7/0047 |
| 2020/0006982 A1* | 1/2020 | Eckhardt | H02J 13/00034 |
| 2020/0021134 A1* | 1/2020 | Caruso | H04Q 9/00 |
| 2020/0153250 A1* | 5/2020 | Price | H02J 3/001 |
| 2020/0209295 A1 | 7/2020 | Marshall et al. | |
| 2020/0366079 A1* | 11/2020 | Telefus | H02M 1/08 |
| 2021/0126574 A1* | 4/2021 | Duggal | E01C 1/00 |

\* cited by examiner

METHODS FOR ELECTRICAL POWER-TRANSFER SYSTEMS

STATEMENT OF RELATED APPLICATIONS

The present application is a continuation of U.S. patent application Ser. No. 17/319,945 filed May 13, 2021, which itself claims priority to, and incorporates fully by reference, U.S. Provisional Patent Application No. 63/024,659 filed May 14, 2020.

FIELD OF THE INVENTION

The present disclosure relates to electrical power-transfer systems.

BACKGROUND OF THE INVENTION

Electrical power-transfer systems are capable of supplying power to and charging devices such as smartphones, electrical vehicle (EV) chargers, etc. Such systems may possess defects and/or develop faults that pose safety hazards, potentially leading to fires, electrocution, etc.

DETAILED DESCRIPTION

Figure 1:
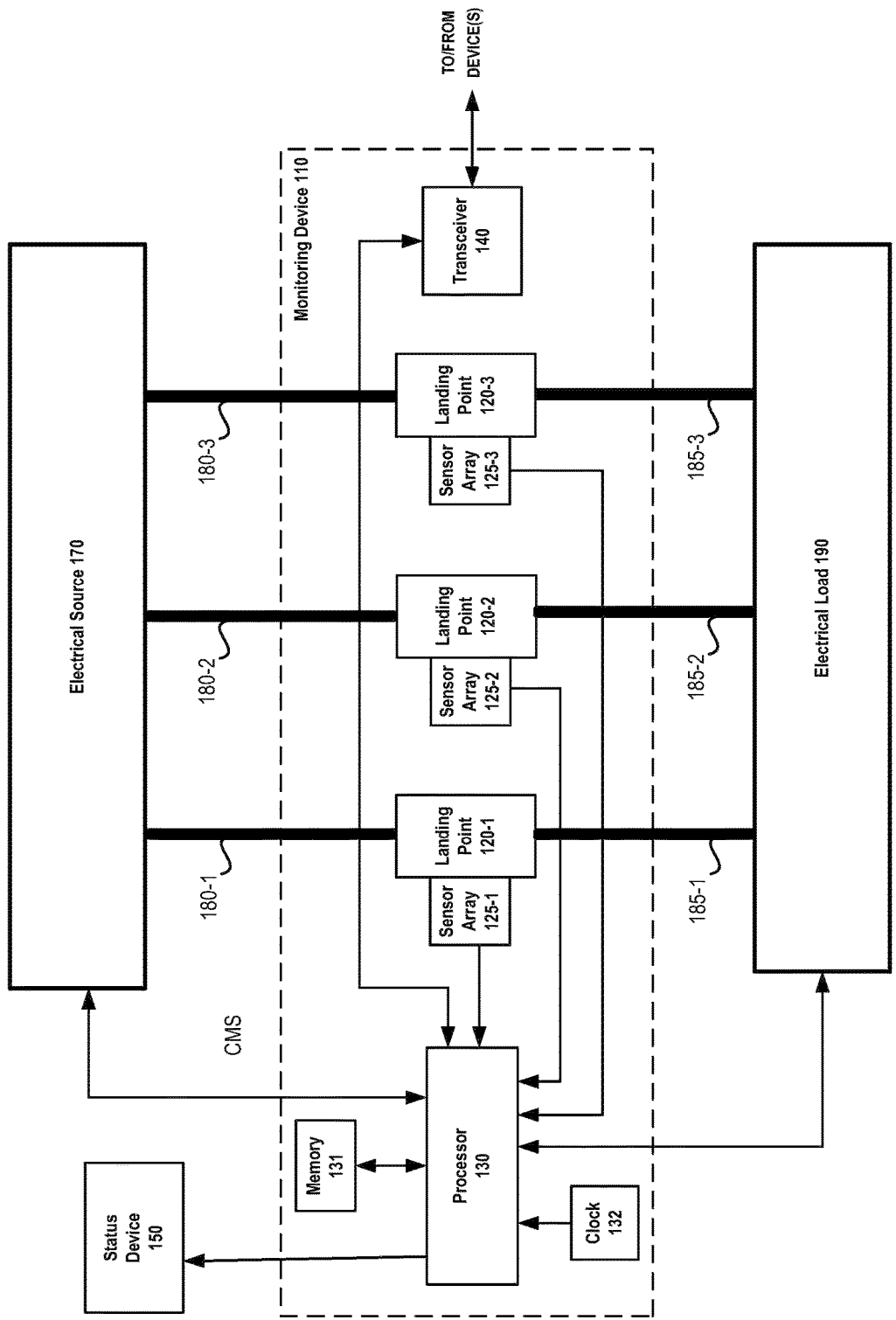
FIG. 1 depicts a block diagram of a system comprising an electrical source, an electrical load, and a power-transfer monitoring device, in accordance with one embodiment of the present disclosure.

Embodiments of the present disclosure are capable of monitoring the operation of an electrical power-transfer system and detecting undesirable and hazardous states of the system. For the purposes of this disclosure, the term "electrical power-transfer system" is defined as an apparatus comprising one or more electrical sources and one or more conductors connected to a power-consuming load. (For convenience and brevity, "electrical power-transfer system" may sometimes be referred to simply as a "power-transfer system").

For the purposes of this disclosure, the term "hazardous state" of an electrical power-transfer system is a state in which one or both of: (1) the system is unsafe as a result of an event-in-progress or an event that has already occurred (e.g., a fire, an earthquake, etc.); and (2) the system has a vulnerability that makes the electrical power-transfer system susceptible to unsafe events. It should be noted that the event triggering the hazardous state might by caused by the system itself (e.g., a fire resulting from conductor corrosion, etc.), or might be an external event (e.g., an earthquake, a flood, etc.). Embodiments of the present disclosure therefore can provide early warnings of future unsafe events.

For the purposes of this disclosure, the term "defect" is defined as a pre-existing flaw. In particular, a defect in a power-transfer system is defined as a flaw in one or more elements of the system (e.g., a conductor, insulation, etc.) that may be present prior to operation of the system. Defects may be due, for example, to defective product materials; product manufacturing defects (e.g., missing strands in a conductor, loose wire strands, improper coiling, improperly-sized conductor crimp, improperly-sized insulation crimp, improper strip length, improper wire insertion, excessive terminal bending, improper crimp positioning, improperly-sized bellmouth, improper carrier cut-off length, bent lock tangs, incomplete lock tangs, misaligned lock tangs, conductive dust, crimp contamination prior to use, corrosion prior to use, interference with connector mating ["terminal butting"], loose fastener screws, incomplete fastener encirclement, etc.); damage from handling and/or installation (e.g., nicks, strand twist damage, bending stress damage, kink damage, etc.); and so forth.

For the purposes of this disclosure, the term "fault" is defined as a flaw that arises during operation of a system, either spontaneously or developing over time. Faults in a power-transfer system may arise, for example, as a result of abrasion, vibration, wear, operational stress, component aging, changing environmental conditions, animal chewing, corrosion (e.g., due to moisture, salt, degradation of an interface between dissimilar metals, etc.), sparking, high-energy charges, overcurrent, magnetic susceptibility (e.g., current leakage paths and short circuits due to metallic ferrous particles, etc.), overheating, seasonal environmental stress, diurnal environmental stress, and so forth.

In some instances, defects/faults in a power-transfer system may be hidden or inaccessible. For example, a defect/fault may be buried underground, embedded in concrete work, located behind a wall, located under a floor, located above a ceiling panel, and so forth. These defects/faults may be exposed by particular events, such as power surges, changing environmental conditions, etc.

Improvements to electrical distribution systems have been made in recent years, including the deployment of ground-fault-circuit-interrupters (GFCIs) and current monitoring transformers paired with current-limiting circuitry. These improvements, however, still fail to guard against failure modes such as latent and time-varying latent hazards. These failure modes were once rare but have become more prevalent with the proliferation of modern mobile appliances that are frequently recharged at high current levels. Mobile appliances are transported between locations and may be connected opportunistically or haphazardly to well-worn connectors. This has made the new failures mode much more common. The higher frequency has increased the probability of occurrence and therefore increased the risk of this hazard class.

A system may appear safe, but the connection of novel devices with new operating characteristics may violate the safe operating envelope without warning, with unanticipated consequences. Further, modern mobile appliances can present dynamic and often dramatic shift in power demand. A case in point is electric vehicles whose appetite for power can exceed the capacity for most fixed electrical systems. In this case, the devices nearly always challenge the upper capacity limits of the stationary infrastructure to which they connect.

FIG. 1 depicts a block diagram of an electrical power-transfer system 100, in accordance with one embodiment of the present disclosure. As shown in the figure, electrical power-transfer system 100 comprises a power-transfer monitoring device 110 that is inserted between an electrical source 170 (e.g., a battery, a solar array, a connection to a utility grid, a distribution panel, etc.) and a power-consuming electrical load 190 with battery storage (e.g., an EV charger, etc.), thereby forming a conducting path electrical source 170→power-transfer monitoring device 110→electrical load 190 that transfers power from electrical source 170 to electrical load 190, thereby "charging" electrical load 190. In one embodiment, electrical source 170 comprises a branch circuit that is protected by a circuit breaker.

In one example, electrical source 170 is stationary and electrical load 190 is a mobile appliance (e.g., a mobile electrical vehicle [EV], a lawn mower, a wheelchair, etc.) that can be connected to and disconnected from power-transfer monitoring device 110, or, when power-transfer monitoring device 110 is not present, can be connected to and disconnected from electrical source 170. Electrical load 190 is a consumer of electric power, and typically incorporates storage for future use when disconnected from the electrical source. As will be appreciated by those skilled in the art, in some embodiments electrical source 170 might supply power via alternating current (AC), while in some other embodiments electrical source 170 might supply power via direct current (DC).

In some embodiments, electrical load 190 is capable of protecting its internal battery by either accepting charging current or by blocking power. Admittance (charging) or rejection (non-charging) is accomplished with a built-in power conversion device or a BMS (Battery Management System), which are incorporated in some electrical loads for safety, longevity, and self-protection. In AC power systems, the power admittance involves a conversion from AC (incoming line) to DC (for battery energy storage). With modern converters, the rate of power conversion is controllable or "dispatchable."

Electrical power-transfer system 100 further comprises a status device 150 that is capable of receiving signals from processor 130 indicating the operational status of the system, thereby facilitating diagnostic operations. In some implementations, the signals may also be used for setup and parametric adjustment of installation-specific parameters (e.g., electrical properties such as operating voltage; system capacity; response time; AC or DC operation, etc.), as well as for specification of environmental operating characteristics (for example, at the time of installation).

In some examples, status device 150 might be a display (e.g., a text display, a graphical user interface (GUI) touchscreen, etc.), while in other examples status device 150 might be an on/off indicator light, while in still other examples status device 150 might be some other type of transducer such as a speaker, while in yet other examples status device 150 might be a wireless or wireline conduit (e.g., a Wi-Fi base station, etc.) that can connect to a smartphone or other type of device. In one embodiment, communication between processor 130 and 150 is via a serial-interface data communication line.

As shown in FIG. 1, power-transfer monitoring device 110 comprises landing points 120-1, 120-2, and 120-3, sensor arrays 125-1, 125-2, and 125-3, processor 130, memory 131, clock 132, and transceiver 140, interconnected as shown. The landing points 120-1, 120-2, and 120-3 are connected to electrical source 170 via respective conductors 180-1, 180-2 and 180-3, and are connected to electrical load 190 via respective conductors 185-1, 185-2 and 185-3. The points provide mechanical stability and an electro/acoustic/thermal conductive reference. In some embodiments, landing points 120-1, 120-2, and 120-3 might be electrically-conductive terminals, while in some other embodiments landing points 120-1, 120-2, and 120-3 might be mechanically clamped or crimped on to conductors 180/185, while in yet other embodiments landing points 120-1, 120-2, and 120-3 might be connected to conductors 180/185 via a combination of these techniques (for example, landing point 120-1 is an electrically-conductive terminal, landing point 120-2 is mechanically clamped to conductors 180-2 and 185-2, and landing point 120-3 is mechanically crimped to conductors 180-3 and 185-3.

In some embodiments conductors 180 might be solid wires, while in some other embodiments conductors 180 might be stranded wires, while in still other embodiments conductors 180 might be something else (e.g., cables, bus bars, printed circuit traces, etc.). In some embodiments, conductors 180-1/180-2/180-3 might be uniform in type (e.g., all three conductors are solid wires, all three conductors are stranded wires, etc.), while in some other embodiments conductors 180-1/180-2/180-3 might vary in type (e.g., two of the conductors solid wires and one conductor stranded wire; one conductor a solid wire, one conductor a stranded wire, and one conductor a cable; etc.). In addition, in some embodiments conductors 180-1/180-2/180-3 might be insulated, while in some other embodiments conductors 180-1/180-2/180-3 might be uninsulated, while in still other embodiments, one or two of the conductors might be insulated and the remaining conductor(s) uninsulated.

Landing points 120 are further connected to electrical load 190 via conductors 185-1, 185-2 and 185-3, which deliver power to electrical load 190. Conductors 185-1, 185-2 and 185-3, like conductors 180-1, 180-2 and 180-3, may be solid wires, stranded wires, cables, bus bars, printed circuit traces, etc. In some embodiments, conductors 185-1/185-2/185-3 might be of the same type, while in other embodiments conductors 185-1/185-2/185-3 might vary in type. In addition, in some embodiments conductors 185-1/185-2/185-3 might be insulated, while in some other embodiments conductors 185-1/185-2/185-3 might be uninsulated, while in still other embodiments, one or two of the conductors might be insulated and the remaining conductor(s) uninsulated.

In some examples, a conductor 180-$i$ might comprise a plurality of conducting segments joined via one or more junction points (e.g., a safety box that contains a splice, a busbar, a branch connection point, etc.). In some such instances the segments might be of the same type (e.g., all are solid wires, etc.), while in other instances the segments might vary in type. Similarly, in some instances the number and type of segments might be the same for all three conductors 180, 180-2 and 180-3, while in other instances the number of segments might vary, or the type of segments might vary, or both.

In some examples, a conductor 185-i might, like conductor 180-i, comprise a plurality of conducting segments joined via one or more junction points. In some such examples the segments might be of the same type (e.g., all are solid wires, etc.), while in other instances the segments might vary in type. Similarly, in some examples the number and type of segments might be the same for all three conductors 185-1, 185-2 and 185-3, while in other instances the number of segments might vary, or the type of segments might vary, or both. The above examples may be true, for example, when one or more connectors and/or one or more plug receptacles are present.

In some examples, each conductor 185-i might be of the same composition as respective conductor 180-i, while in other examples, one or more of the conductors 185 might be of a different type than respective conductor(s) 180. Further, in some embodiments conductors 185-1, 185-2 and 185-3 might be insulated, while in some other embodiments conductors 185-1, 185-2 and 185-3 might be uninsulated, while in still other embodiments, one or two of the conductors might be insulated with the remaining conductor(s) uninsulated.

In one embodiment, conductors 180-1 and 185-1 are positive (or "hot") conductors, conductors 180-2 and 185-2 are negative (or "return") conductors, and conductors 180-3 and 185-3 are neutral reference (or "safety earth") conductors. It should be noted that some other embodiments might use only two conducting paths, rather than three conductive paths (i.e., two landing points 120-1 and 120-2, respective sensor arrays 125-1 and 125-2, and respective conductors 180-1/185-1 and 180-2/185-2). This might be a viable option for certain low-cost or non-critical applications, however a two-conductor arrangement is generally less desirable. In particular, such systems will not comply with modern safety codes, and have reduced perceptive capability that may reduce system performance. In addition, redundancy, which is beneficial for self-calibration and self-test purposes, in reduced in two-conductor systems compared to three-conductor systems.

It should further be noted that some other embodiments might use four conducting paths rather than three (e.g., for a three-phase circuit, etc.). Such embodiments could comprise four landing points 120-1, 120-2, 120-3 and 120-4, respective sensor arrays 125-1, 125-2, 125-3 and 125-4, and respective conductors 180-1/185-1, 180-2/185-2, 180-3/185-3, and 180-4/185-4.

Each sensor array 125-i is capable of obtaining measurement data pertaining to one or more parameters (for example, one or more values of one or more measured properties; a function of one or more values of one or more measured properties, such as a rounding function, an averaging function, a differential over time [e.g., a high-pass filter, etc.]; and so forth), and is further capable of providing these data to processor 130. In one embodiment, sensor arrays 125 are integrated circuits that communicate with processor 130 via a shared serial bus. The composition of sensor arrays 125 and their associated parameters in one embodiment are described in detail below with respect to FIGS. 2 and 3.

Processor 130 is capable of receiving data from sensor arrays 125 and performing the methods of FIGS. 5 and 6 described below. In one embodiment, processor 130 is a special-purpose processing device such as a digital signal processing (DSP) microcontroller, an application specific integrated circuit (ASIC), a field programmable gate array (FPGA), or the like. In some other embodiments, processor 130 may be a general-purpose processing device, such as a microprocessor, central processing unit, or the like. More particularly, processor 130 may be a complex instruction set computing (CISC) microprocessor, a reduced instruction set computing (RISC) microprocessor, a very long instruction word (VLIW) microprocessor, a processor implementing other instruction sets or combinations of instruction sets, or the like. Such processors may execute instructions stored in memory 131, including instructions corresponding to one or more blocks of the methods of FIGS. 7 through 13 described below, read data from memory 131, and/or write data to memory 131. It should be noted that while a single processor is depicted in FIG. 1, in some other embodiments power-transfer monitoring device 110 might comprise a plurality of processors.

Memory 131 stores data and executable instructions, including instructions and data corresponding to the methods of FIGS. 7 through 13 described below, and may include volatile memory devices (e.g., random access memory [RAM]), non-volatile memory devices (e.g., flash memory), and/or other types of memory devices. Clock 132 transmits the current time, date, and day of the week to processor 130 in well-known fashion.

In one embodiment, power-transfer monitoring device 110 comprises a printed circuit board on to which landing points 120, sensor arrays 125 and processor 130 are mounted. In some examples, each landing point 120-i is a conductive printed pad comprising a two-dimensional clad plate that is soldered to sensor array 125-i and/or processor 130. Materials such as fiberglass, polyester, polymide, etc. may be used to provide thermal insulation by which isolation and sensory independence between sensor arrays 125-1, 125-2, and 125-3 are maintained.

In one embodiment, processor 130 is capable of transmitting data signals and control signals to electrical source 170 and is further capable of receiving signals from electrical source 170, as indicated in FIG. 1. In one implementation, signals between processor 130 and electrical source are transmitted/received via a serial-interface data communication line. It should be noted that in some other embodiments, signals may be transmitted in one direction only, from processor 130 to electrical source 170.

In one example, the control signals are ON/OFF binary signals capable of controlling a safety relay of electrical source 170, and of interrupting power delivery by electrical source 170. As described in detail below, data signals may include status information pertaining to safety, performance, carrying capacity, availability, etc. Operational status may be reported as a stream of data updates and may include, for example, instantaneous system performance, safety status, voltage, frequency, current, ampacity, availability, time, historical events with time-stamps, and so forth. The status reported may describe one of several states—for example, system available, system unavailable, system idle, system in use, system reserved, or system out-of-service with diagnostic subcode for maintenance purposes. This status may change over time as the system goes through repeated cycles of use.

Under normal safe operating conditions, processor 130 transmits a control signal that instructs electrical source 170 to continue supplying power. When a potentially-hazardous condition is detected, processor 130 instead transmits a control signal (e.g., an exception flag, etc.) that instructs electrical source 170 to modulate, temporarily interrupt, or completely shut off the flow of power, as appropriate, based on the particular condition. In some implementations this functionality may be provided by an interruptive solid-state switch circuit breaker, which can be tripped OFF (e.g., by injecting a tiny leakage current into the breaker's leak-detection or GFCI circuit., etc.). In some other implementations, a relay contactor, voltage control, or current control may be employed.

In one embodiment, processor 130 is further capable of transmitting data signals and control signals to electrical load 190. In one example, data signals transmitted to electrical load 190 may, like the data signals transmitted to electrical source 170, include status information pertaining to safety, performance, carrying capacity, availability, etc. Under normal safe operating conditions, the signals will indicate whether or not electrical load 190 has permission to continue drawing power (e.g., "OK to Charge", "Do Not Charge Now", etc.). In one embodiment, the signals may also control the rate of power transfer (e.g., maximum, 25% reduction, 50% reduction, etc.), as well as timing (e.g., scheduled delays, periodic power transfer, etc.).

In some implementations, communications between processor 130 and electrical load 190 are via a serial-interface data communication line that is also capable of detecting and announcing when electrical load 190 has been disconnected, and when some other electrical load has been connected. In some other implementations, an analog proportional interface or a pulse width modulation (PLM) time-based signal may be employed in lieu of a serial interface.

Transceiver 140 is capable of receiving signals from one or more devices (e.g., a personal computer, a server, a wireless base station, an off-board GPS receiver, etc.), and forwarding to processor 130 data encoded in these signals (e.g., location-related data, time-related data, ambient characteristic data, etc.). Transceiver 140 is further capable of receiving data from processor 130, encoding the data in signals and transmitting the signals (e.g., transmitting sensor data to a remote computer system that performs monitoring, etc.)

In some embodiments, transceiver 140 may communicate with devices via wireless signals (e.g., RF signals, etc.), while in some other embodiments transceiver 140 may communicate via wireline signals (e.g., Ethernet, etc.), while in still other embodiments transceiver 140 may employ a plurality of communication technologies and/or protocols (for example, Wi-Fi, Bluetooth, Ethernet, and CDMA). It will be appreciated by those skilled in the art that in the latter case, monitoring device may comprise a plurality of transceivers rather than a single transceiver. For convenience, however, this disclosure will simply refer to transceiver 140, regardless of whether monitoring device comprises a single transceiver or a plurality of transceivers.

Figure 2:
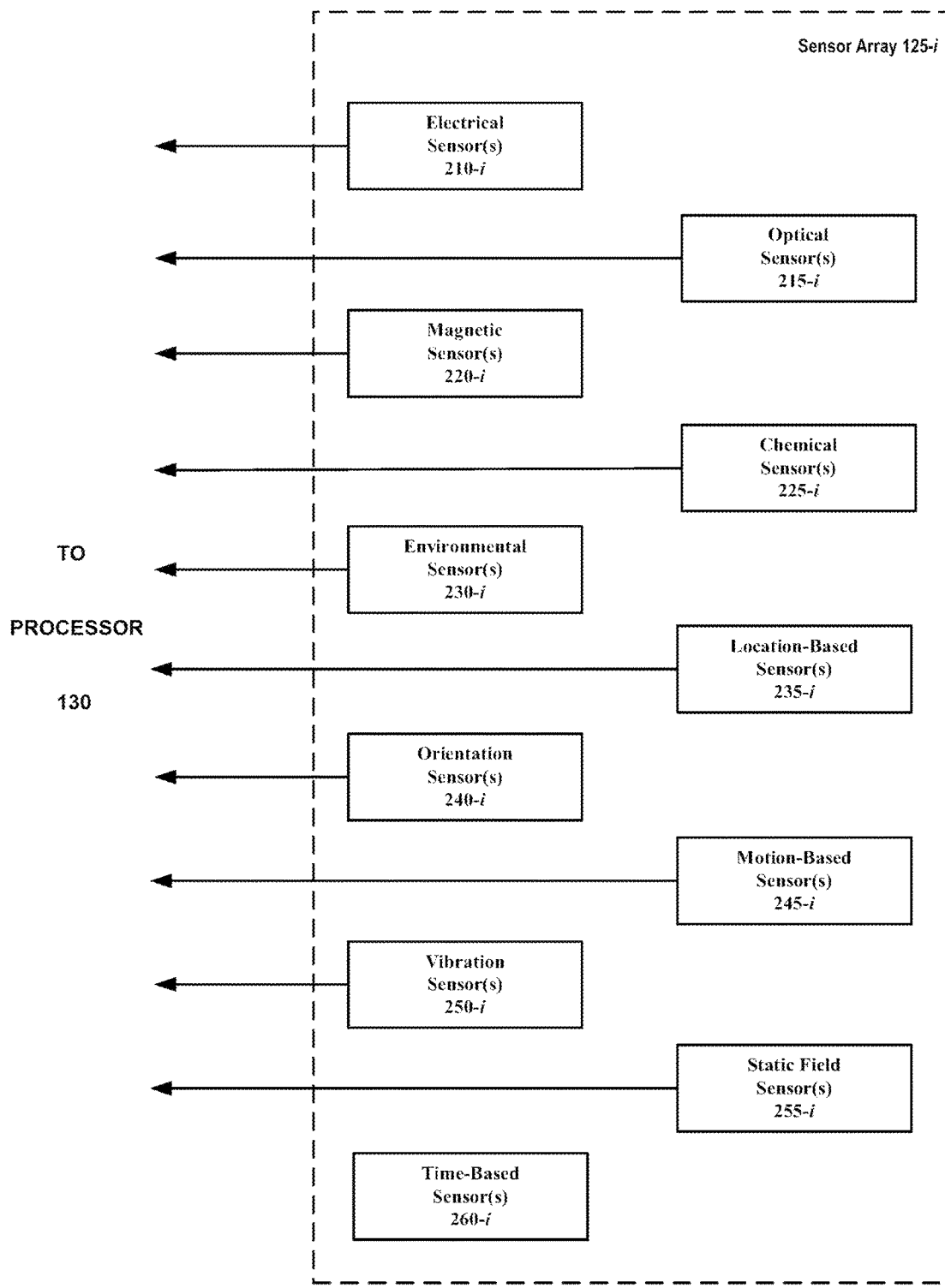
FIG. 2 depicts a block diagram of sensor array 125-$i$, as shown in FIG. 1, in accordance with one embodiment of the present disclosure.
Figure 3:
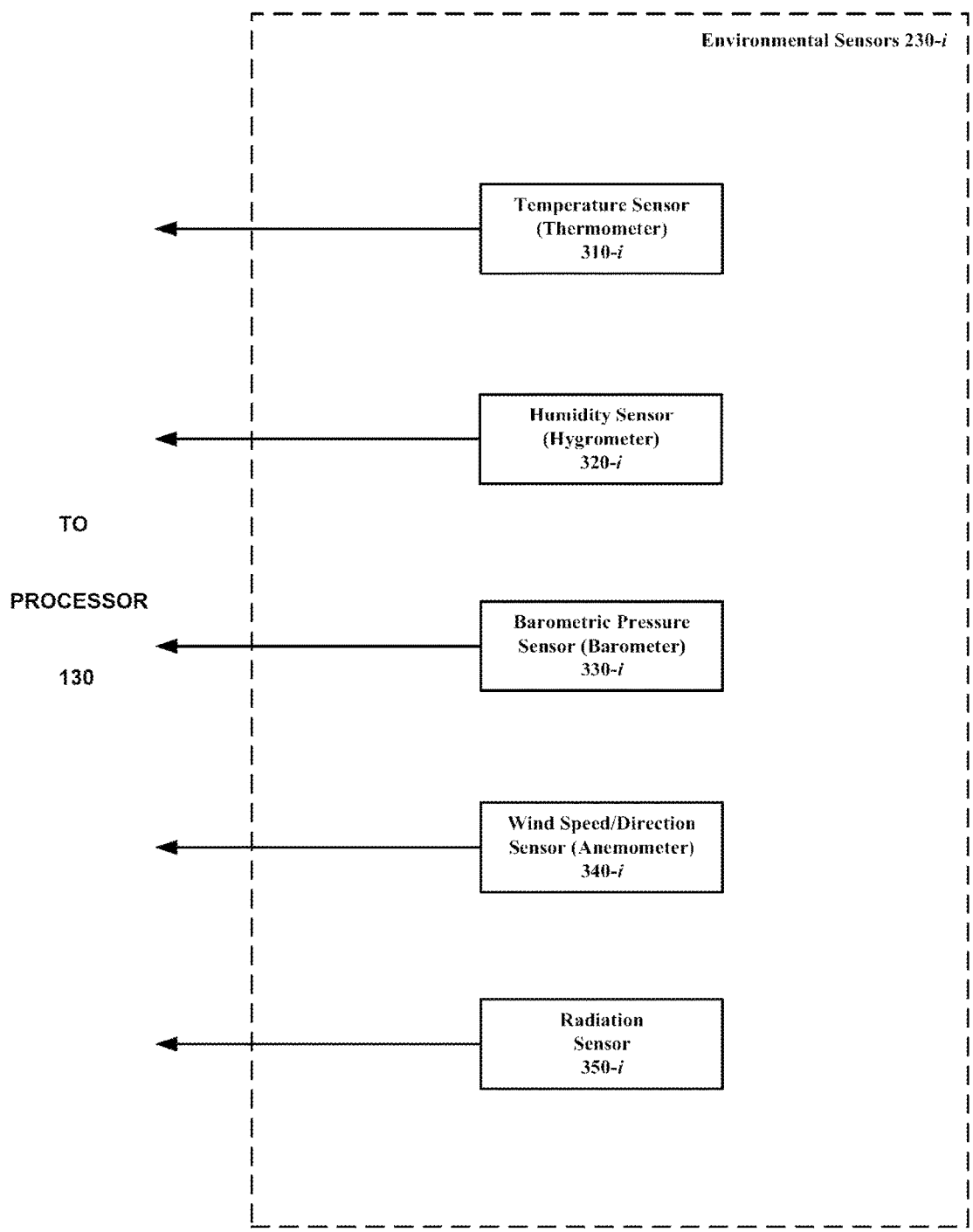
FIG. 3 depicts a block diagram of environmental sensors 230-$i$, as shown in in FIG. 2, in accordance with one embodiment of the present disclosure.

In some embodiments, sensor arrays 125-1/125-2/125-3 might have the same set of sensors, while in some other embodiments, sensor arrays 125-1/125-2/125-3 might have different sets of sensors (e.g., the set of sensors for one sensor array is a proper subset of the sensors of another sensor array; the set of sensors for one sensor array is a proper subset of the sensors of another sensor array, augmented with one or more additional sensors not depicted in FIGS. 2 and 3; the set of sensors for one sensor array and the set of sensors for another sensor array are disjoint; etc.).

In accordance with some embodiments, the three sensor arrays might be uniform in attitude, while in some other embodiments, they may vary in attitude. For example, when the sensor arrays comprise optical sensors, which may have sensitive surfaces, it might be advantageous to orient the sensor arrays at different angles, particular when they have narrow cones and/or limited focus (e.g., one up, one left, and one right; etc.). Similarly, in some embodiments the three sensor arrays might be uniform in environmental properties such as bandwidth, wavelength etc.), while in some other embodiments they may have different environments. As will be appreciated by those skilled in in the art, the particular choice of attitudes/environments might be made in order to bring out a particular quality that is relevant to the application (e.g., bandwidth, center frequency, etc.).

In addition, some embodiments may employ insulation and/or isolation between the sensor arrays. In the case of optical sensors, for example, opaque material might be placed in between the sensors, while for acoustic and/or vibration sensors, mechanical insulation and/or isolation might be employed, while for magnetic sensors, a magnetic shield (e.g., mumetal, etc.) might be employed.

In some embodiments, electrical power-transfer system 100 may have the capability to reverse the flow of power (a "two-way system"), so that electrical load 190 can be discharged during particular time intervals in addition to being charged during other time intervals. During discharge, power flows out of electrical load 190 toward electrical source 170, thereby driving electrical source 170. Discharge may be useful, for example, during a power outage when electrical source 170 becomes disconnected from its power supply. For the case where electrical load 190 is an electrical vehicle, this discharge is sometimes referred to as "V2G". In one embodiment, the operation of power-transfer monitoring device 110 is unaffected by the direction of power flow, functioning in the same manner and equally well in both directions (e.g., in charging and discharging modes, etc.).

FIG. 2 depicts a block diagram of sensor array 125-$i$, as shown in FIG. 1, in accordance with one embodiment of the present disclosure. As shown in FIG. 2, sensor array 125-$i$ comprises: electrical sensor(s) 210-$i$, which are capable of obtaining measurements of one or more electrical properties such as voltage, current, resistance, impedance, inductance, etc.; optical sensor(s) 215-$i$, which are capable of obtaining measurements of optical properties such as color, photosensitivity, intensity, etc.; magnetic sensor(s) 220-$i$, which are capable of obtaining measurements of magnetic properties such as magnetic strength, dip (vertical inclination relative to gravity, consisting of magnitude in degrees and heading angle from magnetic north), direction (e.g. pitch/yaw/roll, etc.), polarity, etc.; chemical sensor(s) 225-$i$, which are capable of obtaining measurements of chemical properties such as pH, flammability, salinity, etc.; environmental sensor (s) 230-$i$, which are capable of obtaining measurements of various environmental properties, as described in detail below with respect to FIG. 3; location-based sensor(s) 235-$i$, which are capable of obtaining measurements of location-related information such as geo-location and proximity via, for example, a GPS receiver, an indoor wireless location system, etc.; orientation sensor(s) 240-$i$, which are capable of obtaining measurements such as attitude angle, pitch angle, gravimetric intensity, etc.; motion-based sensor(s) 245-$i$, which are capable of obtaining measurements such as speed, acceleration, etc.; vibration sensor(s) 250-$i$, which are capable of obtaining measurements of mechanical vibration such as magnitude, frequency, etc.; static field sensors 255-$i$, which are capable of obtaining measurements of DC; and time-based sensor(s) 260-$i$ that are capable of establishing highly-precise time references of events (e.g., environmental events; the time-of-flight of an injected pulse, which can be used to determine proximity; the reaching of thresholds, the occurrence of transitions, etc.).

It should be noted that in some embodiments, one or more of the above data may be obtained from a remote source instead of an on-board sensor, or in some instances by both an on-board sensor and remote source. For example, geo-location information might be obtained via transceiver 140 from a location server or an off-board GPS receiver, either instead of, or in combination with location-based sensor(s) 235-*i*. It should further be noted that in some alternative embodiments, sensor array 125-*i* might comprise a different set of sensors (e.g., a subset of the sensors depicted in FIG. 2, a superset of the sensors depicted in FIG. 2, a set of sensors consisting of a subset of the sensors depicted in FIG. 2 in combination with one or more additional sensors, etc.).

FIG. 3 depicts a block diagram of environmental sensors 230-*i*, as shown in FIG. 2, in accordance with one embodiment of the present disclosure. Environmental sensors 230-*i* comprises thermometer 310-*i*, which is capable of obtaining temperature measurements, in well-known fashion; hygrometer 320-*i*, which is capable of obtaining humidity measurements, in well-known fashion; barometer 330-*i*, which is capable of obtaining barometric pressure measurements, in well-known fashion; anemometer 340-*i*, which is capable of obtaining measurements of wind speed and direction, in well-known fashion; and radiation sensor 350-*i*, which is capable of obtaining radiation level measurements (e.g., infrared, ultraviolet, visible light, radio frequency, microwave, millimeter wave, particle, alpha rays, beta rays, gamma rays, etc.).

As noted above for sensor array 125-*i*, in some embodiments some or all of the above environmental data may be obtained from a remote source instead of, or in addition to, on-board sensor(s). It should further be noted that in some alternative embodiments, environmental sensors 230-*i* might comprise a different set of sensors (e.g., a subset of the sensors depicted in FIG. 3, a superset of the sensors depicted in FIG. 3, a set of sensors consisting of a subset of the sensors depicted in FIG. 3 in combination with one or more additional sensors, etc.).

The sensors in sensor arrays 125 can be divided into two classes: passive sensors, and active sensors. A passive sensor is noninvasive and obtains measurements silently, through observation only. Examples include sensors in the set of electrical sensors 210 measuring voltage and current; sensors in the set of orientation sensors 240 measuring attitude, pitch, and gravimetric intensity; and so forth. An active sensor, in contrast, injects a stimulus (e.g., a radio frequency pulse, a DC potential voltage, an ultrasonic signal, etc.) and measures one or more parameters of the response to the stimulus. Examples include sensors in the set of electrical sensors 210 that measure resistance and inductance; sensors in the set of time-based sensors 260 that measure the time-of-flight of an injected pulse; and so forth.

Figure 4:
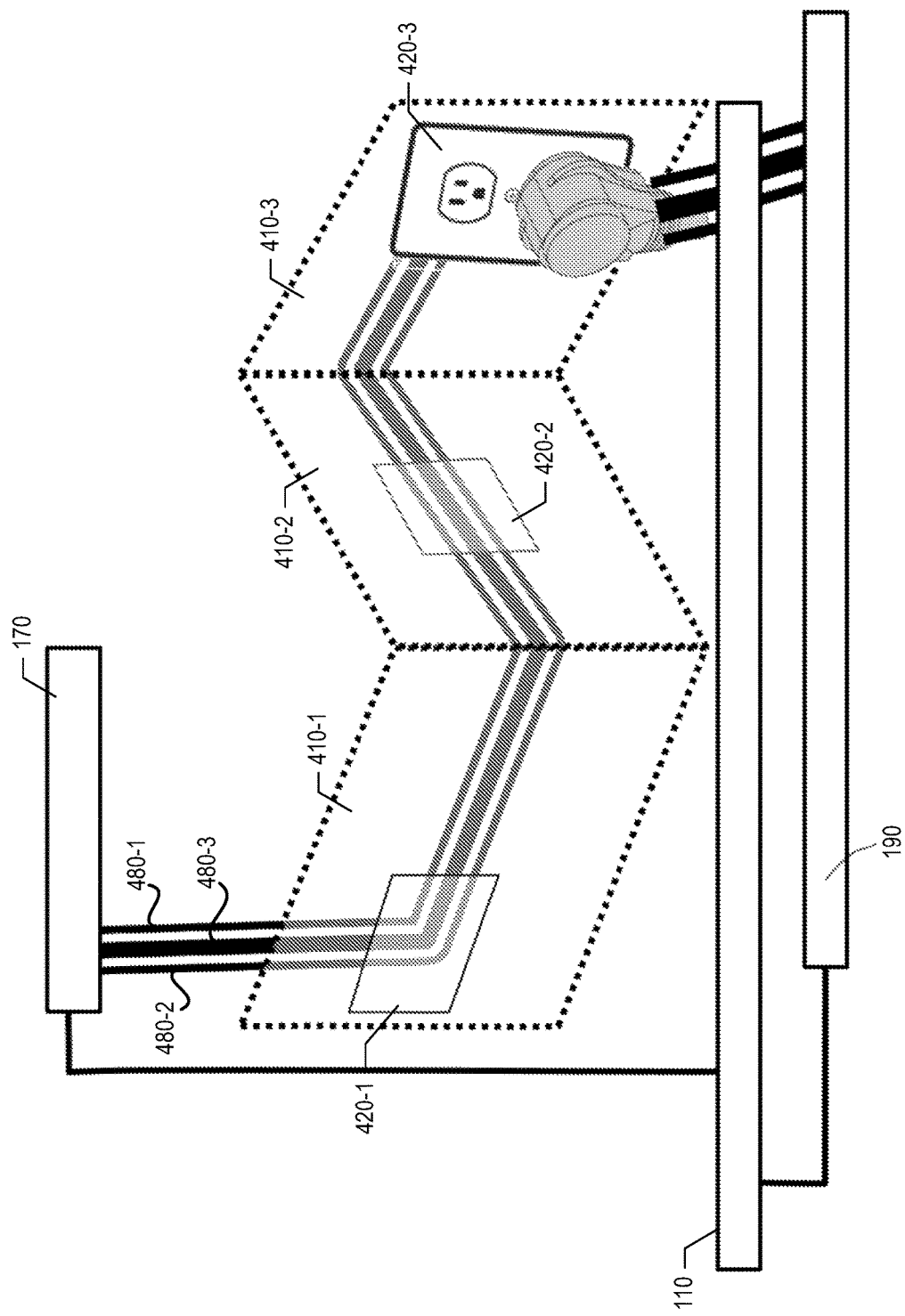
FIG. 4 depicts an example installation of power-transfer monitoring device 110, as shown in FIG. 1, in accordance with one embodiment of the present disclosure.

FIG. 4 depicts a first example installation of power-transfer monitoring device 110 in accordance with one embodiment of the present disclosure. As shown in FIG. 4, the installation includes, interconnected as shown: power-transfer monitoring device 110, electrical source 170, electrical load 190, of FIG. 1; wall segment 410-1 housing a first portion of a conductor 480-1, a first portion of a conductor 480-2, a first portion of a conductor 480-3, and a first junction box 420-1; wall segment 410-2 housing a second portion of conductor 480-1, a second portion of conductor 480-2, a second portion of conductor 480-3, and a second junction box 420-2; wall segment 410-3 housing a third portion of conductor 480-1, a third portion of conductor 480-2, a third portion of conductor 480-3, and a third junction box 420-3 comprising an electrical receptacle that can accommodate different appliance types and sizes and can provide a disconnectable interface; conductors 180-1, 180-2, and 180-3 connecting power-transfer monitoring device 110 to electrical source 170; and conductors 185-1, 185-2, and 185-3 connecting power-transfer monitoring device 110 to electrical load 190.

Wall segments 410 serve to isolate the conductors and protect them from damage, as well as to protect users in the facility who might otherwise come into contact with them. In some examples the wall segments may be concrete building foundations or outdoor earthwork, conduits, or concrete sidewalks.

Figure 5:
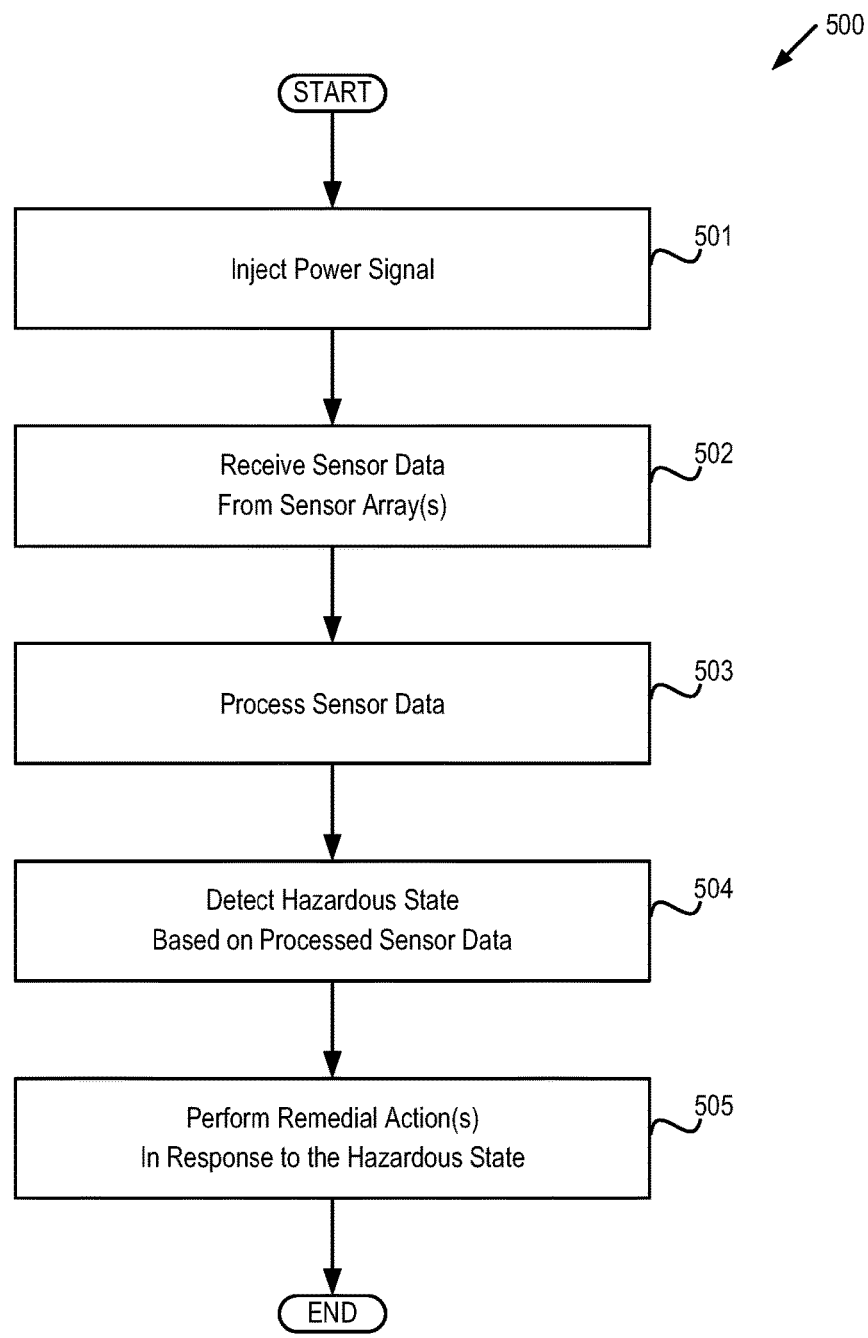
FIG. 5 depicts a flow diagram of aspects of a method for detecting and handling a hazardous state of an electrical power-transfer system, in accordance with one embodiment of the present disclosure.

FIG. 5 depicts a flow diagram of aspects of a method 500 for detecting and handling a hazardous state of an electrical power-transfer system, in accordance with one embodiment of the present disclosure. The method is described below with respect to electrical power-transfer system 100 of FIG. 1; however the method may be performed with respect to some other system. In one embodiment, the method may be performed during one or more of the following times: before electrical load 190 is connected, during transfer of power while electrical load 190 is connected, and after completion of electrical load 190's power-transfer cycle. It should be noted that in some implementations, one or more blocks depicted in FIG. 5 might be performed simultaneously, or in a different order than that depicted. In addition, while a single execution of method 500 is depicted in FIG. 5, method 500 may be performed multiple times (e.g., a pre-determined number of times, at fixed or variable time intervals; in an infinite loop, etc.).

At block 501, a stimulus power signal is injected into electrical power-transfer system 100. The power signal might be a single impulse, a repeated pulse, an active sensor probe, an uninterrupted continuous signal such as an AC sine wave, etc. The particular choice of power signal may be guided with the objective of eliciting a resonant response. It should be noted that two or more independent energized injections may overlap (e.g., normal operating current and an active sensor probe signal, etc.).

In some embodiments, the sensing cycle of a sensor comprises the injection of a stimulus signal and subsequent measurement of the return signal. For example, a proximity sensor may actively inject a pulse into its associated conductor and measure the time-of-flight for the reverberant pulse to return.

Figure 7:
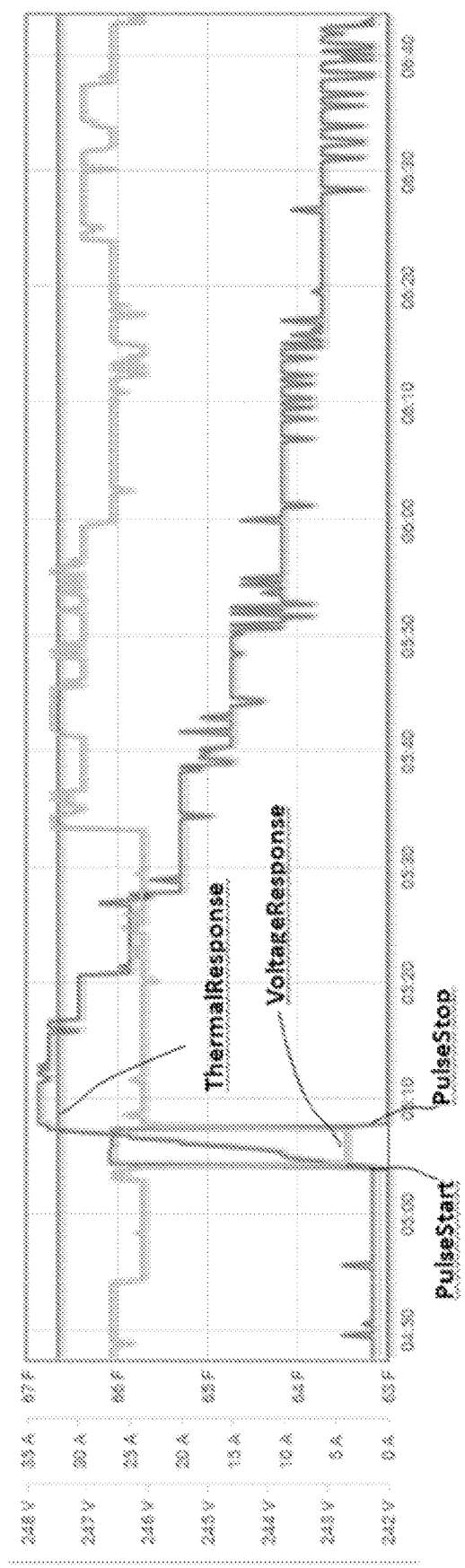
FIG. 7 depicts an example impulse response characteristic in accordance with one embodiment of the present disclosure.

In accordance with one embodiment, the power signal is injected under the control of power-transfer monitoring device 110 by commanding electrical source 170 to connect to a source of electric-potential, and if loaded, to cause electric current to flow. This modulates the flow of current, which provides a stimulus that courses through the power-transfer system 100 and acts as a probe. The modulation thus enables sensor arrays 125 to measure changes that are associated with or induced by the power-transfer activity. As described below, the resultant signal returned to power-transfer monitoring device 110, which is measured by sensor arrays 125, can expose and illuminate potential hazards. An example impulse response characteristic for temperature and voltage is shown in FIG. 7.

At block 502, processor 130 of power-transfer monitoring device 110 receives one or more sensor measurements from one or more of sensor arrays 125-1, 125-2 and 125-3. In some examples, the sensor measurements may be made during the injection of the signal, while in some other examples the sensor measurements may be made after the injection of the signal. In one embodiment, the sensor measurements are sampled, with the sampling being triggered by an interrupt. In some implementations the interrupts might occur at fixed time intervals, while in some other implementations the interrupts might occur at variably-sized time intervals. As will be appreciated by those skilled in the art, in some other embodiments sampling might be triggered by some other type of event, rather than an interrupt (e.g., by a detection of a change in a sampled parameter or in a signal differential, etc.), while in still other embodiments the sensor measurements might be received continuously or near-continuously.

At block 503, the sensor measurements received at block 502 are processed. In one embodiment, blocks 502 and 503 are both performed by processor 130 in response to a single interrupt or event. In some other embodiments, blocks 502 and 503 might be performed in response to separate, successive interrupts/events. In some implementations the successive interrupts/events might be of different types, while in some other implementations the successive interrupts/events might be of the same type.

In one embodiment, the processing of sensor measurements includes the computation of functions (e.g., proportional, integral, and derivative factors; noise removal; imputation; prognostic projections and estimates; derivatives [e.g., first derivatives, second derivatives, etc.], averages, moving averages, etc.). In one implementation, data from sensor arrays 125-1, 125-2 and 125-3 are stored in a three-dimensional data structure, and successive instances of the data structure are stored in a circular buffer. In one example, the circular buffer is sufficiently large to hold data for a complete migration cycle to estimate the probability of an impending fault condition.

At block 504, processor 130 detects a hazardous state of electrical power-transfer system 100 based on the processed sensor measurements. In one embodiment, state includes one or both of (1) the state of individual components (e.g. conductors), and (2) the overall state of electrical power-transfer system 100 (e.g., availability, productivity, capacity, safety, etc.).

Hazardous states may be indicated or suggested by a variety of conditions, such as variance in one or more conductors (e.g., dimensional [cross-sectional] variance along a conductor, material variance between conductors [which can cause Ohmic variance], etc.) and/or physical changes in one or more conductors during operation (e.g., due to magnetic changes, vibration, thermal changes, elongation contact, etc.).

In one embodiment, a variety of techniques may be used to detect hazardous states. One such technique is to compare one or more aspects of the current state (e.g., conductor impedance, system capacity, etc.) to a baseline. For example, a baseline profile may be established for diurnal cycles of observable characteristics that may affect system performance. These characteristics may show normal patterns of variance from nominal that can be predicted for example based on date and time schedule or meteorological data. For example, the voltage, frequency, and reluctance of a source of power may be influenced by ambient thermal conditions on long utility lines and transformers that supply utility power over long distances. These may also be affected by incident solar radiation along the line. As another example, seasonal baseline profile may be established. This may be useful in desert locations which experience more extreme variance between summer and winter conditions.

In some embodiments, baseline references may be adjusted based on instantaneous sensor readings at the point of use, or on near-real-time meteorological reports that are associated with deviations from the baseline. For example, a rainstorm can induce observable changes in a power transmission line that affect power quality. Instantaneous observed readings may deviate from an expected baseline. This variance is range-checked, and used as predictive measure. Excessive variance may be associated with an impending fault and may predict an imminent failure condition. Using these techniques, the device can take action, temporarily reducing its load and reducing its exposure to fluctuations. This reduction can serve to isolate any influence from the appliance on the power source, thus stabilizing the source, and also any connected distribution equipment that may be connected.

Figure 8:
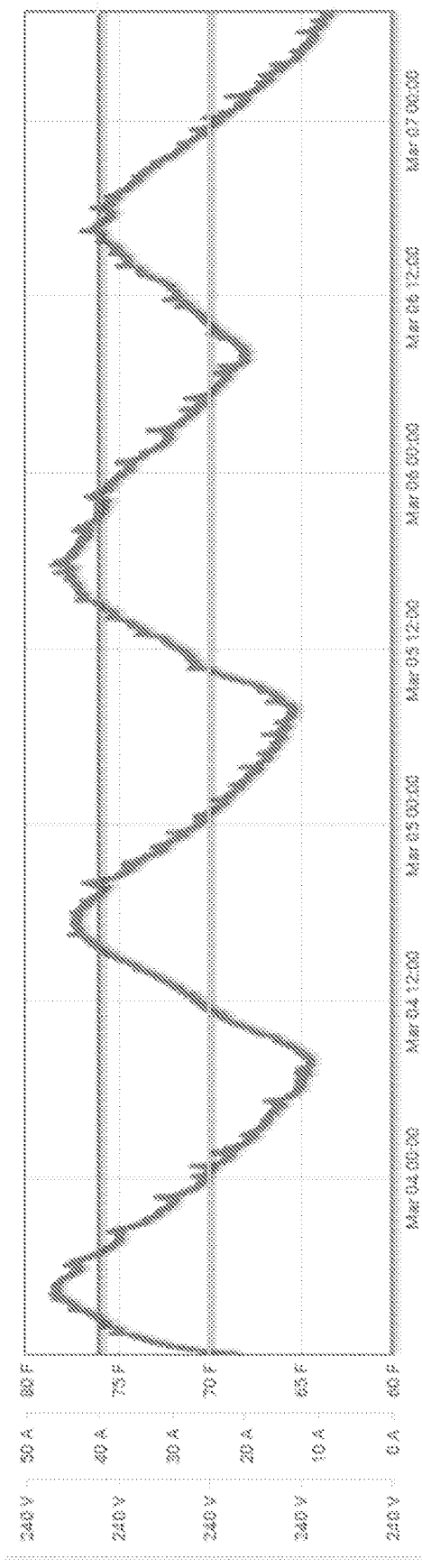
FIG. 8 depicts an example of a typical diurnal pattern for temperature in accordance with one embodiment of the present disclosure.

Another such technique is to identify when one or more aspects of system behavior exhibit a particular pattern known to be associated with hazards (e.g., rapid changes in particular parameters, a change in the relationship between two or more parameters, departures from typical diurnal patterns, etc.). An example of a typical diurnal pattern is depicted in FIG. 8, showing temperature over time. In accordance with one implementation, time-of-day phase angle measurements provide a more direct measure of environmental thermal variance, which may include solar exposure with local inumbration and reflection.

In some examples, the frequency of the sensing cycle may be significantly higher than that of the flow modulations of the operating current (for example, a sensing cycle frequency of multiple times per second, versus a flow modulation frequency of, for example, 6 kHz). In such examples, sensing cycles will occur when operating current flow is off, when current is high, and when current is modulated at mid-level. Accordingly, two additional techniques may be used to detect hazardous states: observing the differential between sensor measurements at various current levels, and observing the differential between sensor measurements at different conductor pairs.

Power quality may be sensed through the waveforms of the single- and three-phase power being transferred. The dynamic AC characteristics of the load may be adjusted in order to avoid excessive current spikes, or to take advantage opportunistically, to stabilize the source, or to isolate and protect the appliance from potential problems upstream.

In some embodiments, both active and passing sensing techniques may be used in conjunction, such that sensor arrays 125-1, 125-2, and 125-3 are independently capable of active signal injection for active sensing (e.g., injecting a reference signal at a specific frequency between a pair of conductors, etc.). In one example, a 20 kHz signal is injected between sensor arrays 125-1 and 125-2 and the impedance between the two sensor arrays is measured. During the signal injection, two additional impedance measurements are made: one between sensor arrays 125-1 and 125-3, and one between sensor arrays 125-2 and 125-3. The impedance measurements characterize different aspects of the conductive environment, and can provide diagnostic clues that indicate pre-emergent fault conditions.

A second phase view may be obtained by injecting a 20 kHz signal between sensor arrays 125-1 and 125-3 and measuring the impedance between these two sensor arrays. In this second phase view, additional impedance measurements are made between sensor arrays 125-1 and 125-2, and between sensor arrays 125-2 and 125-3. Similarly, a third phase view may be obtained by injecting a 20 kHz signal between sensor arrays 125-2 and 125-3 and measuring the impedance between these two sensor arrays. In this third phase view, additional impedance measurements are made between sensor arrays 125-1 and 125-2, and between sensor arrays 125-1 and 125-3.

Impedance between sensor array pairs is just one example of a property that can be actively measured (i.e., measured after signal injection). Other examples include Each of the phase views provides data from a different vantage point, and the overlap in viewpoint redundancy can potentially provide both consistency checking and diagnostic capability (e.g., localizing a defect/fault to a particular conductor, or a particular subset of conductors, etc.). For example, a galvanic corrosion-induced fault condition may be visible from only one particular phase view. Suppose, for example, that corrosive contact exists between sensor arrays 125-2 and 125-3. The interface between these two sensor arrays is measured actively in the third phase view, and is measured passively in the first and second phase views. Under normal conditions (i.e., where there are no defects or faults), measurements would be symmetrical across all phase views. Under abnormal conditions, however, local geometry and chemistry, as well as the geometry of a particular defect/fault may create asymmetrical signatures that can detect defects and existing faults, and predict future faults. Further, changes in measurements over time (e.g., changes in the impedance measurements of the first phase view at two different times, changes in the differences between impendence measurements of the first phase view and second phase view at two different times, etc.) may be used to estimate rate of corrosion and its hazardous criticality.

In accordance with one embodiment, measurements are logged, and the log may be used to guide subsequent off-line diagnostic analysis. The diagnostic records can be provided for external analysis by a human technician, or may also be analyzed algorithmically. For example, the current invention (power-transfer monitor) may spend most of its service life monitoring a power system that never experiences a failure or a shutdown event. Monitoring may be performed continuously over long periods of time. The frequency of fault events can be zero but the incidence of suboptimal but subclinical detections or interventions through modulation may be significantly greater than zero. In these systems, the record of subclinical event occurrences provides a prognostic alarm that can detect the early onset of system degradations long before any failure occurs. Patterns detected in the log of subclinical events can recommend maintenance procedures very specifically, and can guide service that designates specific components for replacement, repair, or refurbishment. This is valuable in applications that are exposed to high-severity failure modes, for example in vehicular, aerospace, and weapons applications. Power monitoring over a long service history provides a deep view into device life to improve serviceability, reliability, and operational confidence. In the most mission-critical or risk-sensitive applications, the tolerance for modulation interventions can be set to zero or near-zero. This retains a full capability for modulation to gracefully degrade performance during an anomaly, but uses a modulation event to trigger or activate a maintenance procedure or replacement. This can provide for example a "limp-home" capability that continues to deliver power at a lower performance level until the service can be completed. Then after a service procedure has been performed, the monitor serves to verify operational capability at the start of a new service life. In some embodiments, passive sensing from multiple phase views can be employed, either in conjunction with sensing from multiple phase views, or on its own (i.e., without multiple-phase-view active sensing). For example, in the case of grounded single-phase, three conductors may be sensed thermally, with conductor pairs compared.

It should be noted that the multiple-phase-view technique disclosed above can be performed in a similar fashion when there are four sensors arrays/conductor pairs (e.g., for a three-phase circuit, etc.), or when there is an even greater number of sensors arrays/conductor pairs, both with active sensing and/or passive sensing. It should be noted that in some embodiments, one or more of blocks 502, 503, and 504 may occur within a monitoring loop not depicted in the flow diagram.

At block 505, one or more remedial actions are taken in response to the hazardous state identified at block 504 are identified. Action is taken programmatically to avoid the problem; the information that enabled detection often describes a rich context that has good diagnostic specificity. This diagnostic detail may be useful to inform subsequent remedial actions. Remediation may for example be applied as repairs, maintenance, or replacement. In this case, the diagnostic information from an event is stored with the event record in memory 131, recalled and presented through status device 150 to a user.

Two classes of automatic or programmatic action that may be applied are safety shutoff and modulation. Safety shutoff is invoked when a clear and present hazard is detected, indicating that operation is unsafe. Modulation may be invoked when conditions indicate a developing or impending hazardous condition that is trending away from normal safe operating conditions. This is used to avoid a problem and reverse the observed operating variance, and automatically return to normal operating conditions. It should be noted that not all conditions can be reversed by modulation: for example, corrosion or wear may be beyond the capability of modulation. In these cases, modulation provides a "graceful degradation" to continue operation without necessitating a shutdown. Continued operation even in a degraded state still has high value, especially in high-reliability systems where downtime may be expensive or even catastrophic (e.g., in aircraft and flight systems, etc.). The farthermost modulation extreme may achieve zero or near-zero current, with correspondingly zero power transfer. This case is similar to a safety shutoff, except that conductors 180 & 185 remain energized, and some minimal level of appliance functionality is maintained.

In one embodiment, the modulation is implemented in a power conversion device within load 190, and is performed in response to a signal from monitoring device 110. The power conversion device may be an AC/DC converter that converts the variable line voltage (AC 1-phase or AC 3-phase or DC) to the specific power needs for the load's internal use. This internal need usually includes a DC battery.

In one embodiment, one or more modulation techniques may be employed, such as pulse width modulation (PWM), frequency modulation (FM), phase modulation (PM), amplitude modulation (AM), or some combination thereof. Each of these modulation techniques constitutes a dimension that is described or prescribed parametrically, and may be described as "load quality modulation."

In one embodiment, three-phase modulation may be employed. To transfer power in three-phase AC form, an appliance must be connected to all three of the power phases. The benefits of three-phase power over single-phase power include improved stability, constant power over time, equilateral grounding, etc. The three phases may be three sine waves spaced 120 degrees, carrying a constant power capacity.

Power from a three phase line may be converted into a format that is most favorable for consumption or end-use.

When an energy storage device or battery is used, direct current is a common format. To convert from the three-phase power transfer mechanism into the internally-preferred DC, the three conductors may be connected to three inverters as follows: conductors 185-1 and 185-2 are connected as an input pair to a first inverter; conductors 185-2 and 185-3 are connected as an input pair to a second inverter; and conductors 185-1 and 185-3 are connected as an input pair to a third inverter.

During operation of power-transfer system 100, processor 130 may discover a fault, anomaly, unbalance, or other suboptimal condition. This detection may be made in the sensor data streams that originate in sensor arrays 125-1, 125-2, and 125-3 (e.g., via some characteristic pattern identified in the sensor signals, etc.). The presence or absence of the pattern in the sensor streams may enable location to be triangulated down to a single conductor, either 185-1, 185-2, or 185-2. An example of a geographically local fault is corrosion that has formed along the conductive metal pathway, leaking current outside the circuit, or restricting the normal flow current inside the circuit. The fault may be present on only one single conductor of the three, with the other two conductors free of any anomaly or problem.

As is described in detail below, defects/faults may be localized via rotating perspective viewpoint relative to an injected sensor signal. These two directional vectors can be thought of as a viewing angle and an angle of illumination. Varying the included angle between these two enhances perceptive power to detect and localize problems.

When sensing has detected an anomaly, perspective sensing and rotating views may be used to narrow down its location spatially or logically. Once the anomaly's location is known, mitigating action can be prescribed with pinpoint accuracy. Action may be implemented by differential modulation in the power conversion layer of the appliance. Actions may be taken that appear as a graceful degradation in performance, thereby enabling continuity of operation and avoiding the need for an abrupt safety stop.

In one embodiment, action is taken by differentially modulating the load profiles on converter/inverter pairs: when an anomaly is located in a single conductor, only the conversion devices that are connected to that conductor are modulated. In one implementation, the modulation is a change in the current profile (amperes over time), and only conversion devices that are connected to the affected conductor are modulated. The remaining conversion device that is not connected to the impacted conductor is not modulated, and continues operation unimpeded.

As an example, consider the case where sensor arrays data indicates the presence of an anomaly. Once the anomaly is detected processor 130 uses multiple sensor viewpoints to localize the anomaly to a single affected conductor, in this case 185-3. Processor 130 forwards the inferred location of to load 190, where control actions are implemented. The second and third inverters are subjected to a modulation of their load profiles. This may reduce the peak current or the power conducted on conductor 185-3. The first inverter may be commanded to continue its operation unimpeded, and conductors 185-2 and 185-1 experience no modulation or degradation.

The power carried by conductors 185-2 and 185-1 is the sum of all three phase currents. While two of the phases are modulated, the available carrying capacity of the remaining phase current is proportionally increased. This enables recovery of some of the capacity lost by reducing the capacity of the affected conductor 185-3.

If and when the sensor arrays detect that an anomaly has passed, the modulation profile restrictions can be eased. This allows the system to lift its modulated state and return to unrestricted functionality. Transitions between these states are performed automatically under software control.

Multi-conductor sensing, combined with three-phase power transfer, provides a synergistic alignment of perceptive power and prescriptive specificity. This resonant matchup extends the beneficial capabilities of the invention favorably.

In one embodiment, the particular modulation technique (s) are selected dynamically based on the particular hazardous state that has been detected. In one implementation, sensor data are associated with the hazardous state to prescribe an appropriate modulation technique that is communicated to the power conversion device and performed during power conversion. The system is pre-programmed with a set of modulation responses to respond to particular hazardous states (e.g., the most common hazardous states, etc.). The risk of the sensed hazard may be estimated from sensed data, and the degree of the modulation response may be prescribed in proportion to the hazard risk (e.g., a proportional relationship between the degree of modulation and a "hazardous state severity scale" from 1 to 10, etc.).

For example, in a three-phase system, a reduction in impedance may develop between conductors 185-2 and 185-3, as detected by sensor arrays (125-1, 125-2, 125-3, and 125-3). The reduction may be a variance from a design specification, or from a calibrated value, or from a historical log that is unique to the device. This condition of reduced-impedance may be caused for example by accumulation of corroded material or other solid or liquid contamination between conductors 180-2, 180-3, 185-2 and/or 185-3, or by a variety of other environmental factors. Note that there are several permutations of conductor pairs where deviance can be measured and detected.

The sensed reading deviates from its expected value in the direction of zero. Readings are made at the sensor arrays 125-1, 125-2, 125-3, and 125-3 and communicated to Processor 130. Software running in Processor 130 uses the communicated readings to calculate an instantaneous DeviationRatio, as: DeviationRatio=1−(ExpectedImpedance−MeasuredImpedance)/ExpectedImpedance). This yields a Ratio as a positive fractional value between 0 and 1 (0% and 100%). This fraction is transformed into a modulation command and communicated to Electrical Load 190, which interprets the command for implementation. Because this in this example corrosive deviance was detected between conductor pair 185-2 and 185-3, the modulation is applied to Inverter 192, which is fed by the same two conductors 185-2 and 185-3. Inverter 192 implements the command by modulating its load profile, for example by reducing the duty cycle of its PWM (pulse-width-modulated) load. This causes a reduction in the RMS current carried by Inverter 192. The remaining two inverters 191 and 193 are not affected by this modulation, and remain functional at their full capacity. The current carried by Conductor 185-1 is not affected by this modulation but conductors 185-2 and 185-3 experience a reduction in their RMS current. This reduces the stress level on corrosion-impacted conductors 185-2 and 185-3 and on their nearby electrical environment. This has the effect of avoiding the risk of a failure event that might be associated with this corrosion. The modulation event is logged for future review for remediation or maintenance service. This review might for example recommend cleaning the area between conductors 185-2 and 185-3, or replacing contacts, insulation, or conductor material. The cycle is accomplished with no failure event, and no need to shut down the system, which remains functional and operational continuously in spite of the modulation. This process localizes the affected region accurately and takes action automatically and rapidly with no need for human attention or intervention, and without shutting down the system.

In one embodiment, the system determines whether the hazardous state has been corrected (e.g., transformed into an non-hazardous state, etc.) by the modulation response. If the modulation failed to correct the hazardous state, then a safety shutdown is performed.

A safety shutoff event may require an inspection or other manual supervisory function before permission is given to resume safe operation. It may also require a minimum time interval to allow calming or cool-down before restoring operation. Depending on the nature or severity of the fault condition, an inspection may be required. This may include a manual visual or electrical inspection to verify that no damage has occurred. The inspection process may also be fully automatic, implemented through sensor arrays 125-1, 125-2, 125-3. All sensor arrays are independently operable, and remain fully functional while Electrical Source 170 is offline, and when Electrical Load 190 is off-line. This allows for their autonomous operation for purposes of pre-inspection and safety qualification.

After block 505 has been performed, method 500 terminates. As described above, although a single execution of method 500 is depicted in FIG. 5, the method may be performed multiple times (e.g., a pre-determined number of times, at fixed or variable time intervals; in an infinite loop, etc.).

Figure 9:
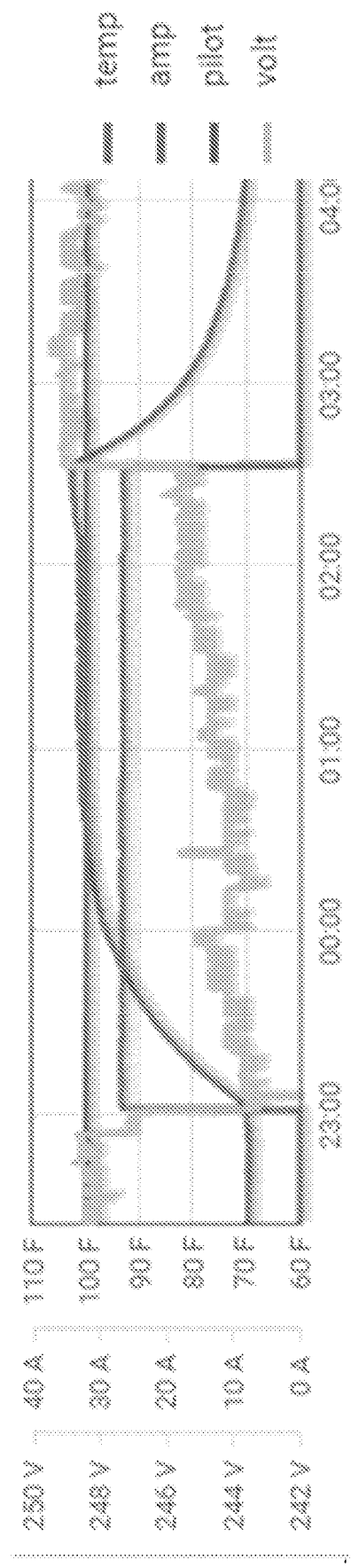
FIG. 9 depicts an example of a power-transfer cycle during a service session in which an electrical load is connected to an electrical power-transfer system, power is transferred to or consumed by the electrical load during the connection, and the electrical load is subsequently disconnected, in accordance with one embodiment of the present disclosure.

In one embodiment, method 500 may be performed during a "service session," in which (1) electrical load 190 is connected conductively, (2) power is then transferred or consumed, and (3) electrical load 190 is then disconnected, ending the session. When electrical load 190 is a mobile appliance, its mobility is restored once the session has ended. An example of a power-transfer cycle during a service session is shown in FIG. 9.

Concepts employed in the techniques disclosed above (i.e., for detecting a hazardous state, performing one or more remedial actions in response to the detection of the hazardous state, and diagnosing a cause of the hazardous state) can also be employed for other types of undesirable states in an electrical power-transfer system. Such undesirable states may include suboptimal states (e.g., power delivery that is less than the maximum capability of the electrical power-transfer system, or is less than a threshold percentage of the maximum capability [for example less than 80% of maximum], etc.) distortions in power line quality, variance in power line quality above a particular threshold, underload, overload, etc. A method for detecting and handling such undesirable states is disclosed below and with respect to FIG. 6.

Figure 6:
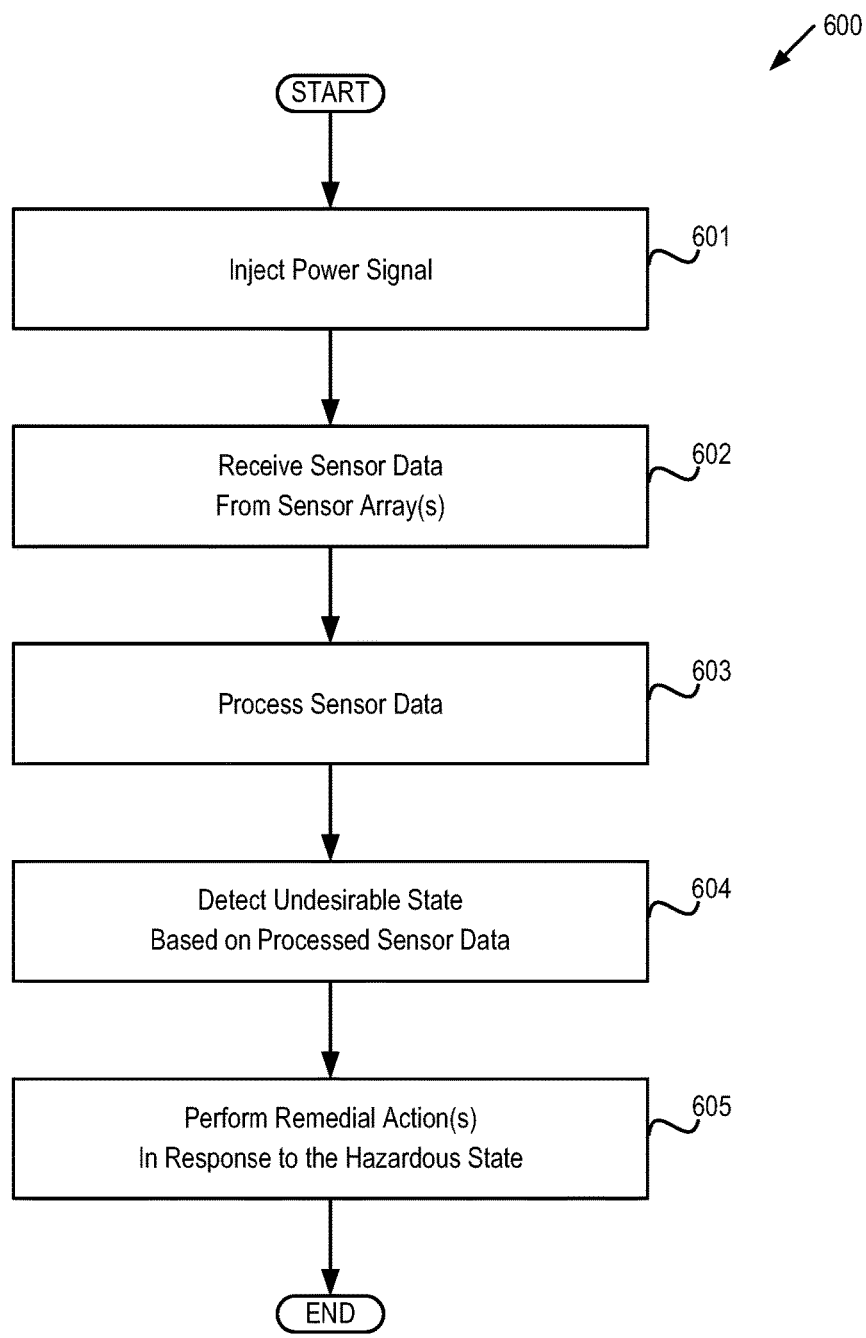
FIG. 6 depicts a flow diagram of aspects of a method for detecting and handling an undesirable state of an electrical power-transfer system, in accordance with one embodiment of the present disclosure.

FIG. 6 depicts a flow diagram of aspects of a method 600 for detecting and handling an undesirable state of an electrical power-transfer system (e.g., distortions in power line quality, variance in power line quality above a particular threshold, underload, overload, etc.), in accordance with one embodiment of the present disclosure. Method 600 is described below with respect to electrical power-transfer system 100 of FIG. 1; however the method may be performed with respect to some other system. In one embodiment, method 600 may be performed during one or more of the following times: before electrical load 190 is connected, during transfer of power while electrical load 190 is connected, and after completion of electrical load 190's power-transfer cycle. It should be noted that in some implementations, one or more blocks depicted in FIG. 6 might be performed simultaneously, or in a different order than that depicted. In addition, while a single execution of method 600 is depicted in FIG. 6, method 600 may be performed multiple times (e.g., a pre-determined number of times, an infinite loop, etc.)

At block 601, a stimulus power signal is injected into electrical power-transfer system 100. The power signal might be a single impulse, a repeated pulse, an active sensor probe, an uninterrupted signal such as an AC sine wave, etc. The particular choice of power signal may be guided with the objective of eliciting a resonant response. It should be noted that two or more independent energized injections may overlap (e.g., normal operating current and an active sensor probe signal, etc.).

In some embodiments, the sensing cycle of a sensor comprises the injection of a stimulus signal and subsequent measurement of the return signal. For example, a proximity sensor may actively inject a pulse into its associated conductor and measure the time-of-flight for the reverberant pulse to return.

In accordance with one embodiment, the power signal is injected under the control of power-transfer monitoring device 110 by commanding electrical source 170 to connect to a source of electric-potential, and if loaded, to cause electric current to flow. This modulates the flow of current, which provides a stimulus that courses through the power-transfer system 100 and acts as a probe. The modulation thus enables sensor arrays 125 to measure changes that are associated with or induced by the power-transfer activity. As described below, the resultant signal returned to power-transfer monitoring device 110, which is measured by sensor arrays 125, can expose and illuminate potential hazards. An example impulse response characteristic for temperature and voltage is shown in FIG. 7.

At block 602, processor 130 of power-transfer monitoring device 110 receives one or more sensor measurements from one or more of sensor arrays 125-1, 125-2 and 125-3. In one embodiment, the sensor measurements are sampled, with the sampling being triggered by an interrupt. In some implementations the interrupts might occur at fixed time intervals, while in some other implementations the interrupts might occur at variably-sized time intervals. As will be appreciated by those skilled in the art, in some other embodiments sampling might be triggered by some other type of event, rather than an interrupt (e.g., by a detection of a change in a sampled parameter or in a signal differential, etc.), while in still other embodiments the sensor measurements might be received continuously or near-continuously.

At block 603, the sensor measurements received at block 602 are processed. In one embodiment, blocks 602 and 603 are both performed by processor 130 in response to a single interrupt or event. In some other embodiments, blocks 602 and 603 might be performed in response to separate, successive interrupts/events. In some implementations the successive interrupts/events might be of different types, while in some other implementations the successive interrupts/events might be of the same type. In one embodiment, the processing of sensor measurements includes the computation of functions (e.g., proportional, integral, and derivative factors; noise removal; imputation; prognostic projections and estimates; derivatives [e.g., first derivatives, second derivatives, etc.], averages, moving averages, etc.). In one implementation, data from sensor arrays 125-1, 125-2 and 125-3 are stored in a three-dimensional data structure, and successive instances of the data structure are stored in a circular buffer.

In one example, the circular buffer is sufficiently large to hold data for a complete migration cycle to estimate the probability of an impending fault condition.

At block 604, processor 130 detects a undesirable state of electrical power-transfer system 100 based on the processed sensor measurements. In one embodiment, state includes one or both of (1) the state of individual components (e.g. conductors), and (2) the overall state of electrical power-transfer system 100 (e.g., availability, productivity, capacity, safety, etc.).

Undesirable states may be indicated or suggested by a variety of conditions, such as variance in one or more conductors (e.g., dimensional [cross-sectional] variance along a conductor, material variance between conductors [which can cause Ohmic variance], etc.) and/or physical changes in one or more conductors during operation (e.g., due to magnetic changes, vibration, thermal changes, elongation contact, etc.).

In one embodiment, a variety of techniques may be used to detect undesirable states. One such technique is to compare one or more aspects of the current state (e.g., conductor impedance, system capacity, etc.) to a baseline. For example, a baseline profile may be established for diurnal cycles of observable characteristics that may affect system performance. These characteristics may show normal patterns of variance from nominal that can be predicted for example based on date and time schedule or meteorological data. For example, the voltage, frequency, and reluctance of a source of power may be influenced by ambient thermal conditions on long utility lines and transformers that supply utility power over long distances. These may also be affected by incident solar radiation along the line. As another example, seasonal baseline profile may be established. This may be useful in desert locations which experience more extreme variance between summer and winter conditions.

In some embodiments, baseline references may be adjusted based on instantaneous sensor readings at the point of use, or on near-real-time meteorological reports that are associated with deviations from the baseline. For example, a rainstorm can induce observable changes in a power transmission line that affect power quality. Instantaneous observed readings may deviate from an expected baseline. This variance is range-checked, and used as predictive measure. Excessive variance may be associated with an impending fault and may predict an imminent failure condition. Using these techniques, the device can take action, temporarily reducing its load and reducing its exposure to fluctuations. This reduction can serve to isolate any influence from the appliance on the power source, thus stabilizing the source, and also any connected distribution equipment that may be connected.

Another such technique is to identify when one or more aspects of system behavior exhibit a particular pattern known to be associated with hazards (e.g., rapid changes in particular parameters, a change in the relationship between two or more parameters, departures from typical diurnal patterns, etc.). An example of a typical diurnal pattern is depicted in FIG. 8, showing temperature over time. In accordance with one implementation, time-of-day phase angle measurements provide a more direct measure of environmental thermal variance, which may include solar exposure with local inumbration and reflection.

In some examples, the frequency of the sensing cycle may be significantly higher than that of the flow modulations of the operating current (for example, a sensing cycle frequency of multiple times per second, versus a flow modulation frequency of, for example, 6 kHz). In such examples, sensing cycles will occur when operating current flow is off, when current is high, and when current is modulated at mid-level. Accordingly, two additional techniques may be used to detect undesirable states: observing the differential between sensor measurements at various current levels, and observing the differential between sensor measurements at different conductor pairs.

Power quality may be sensed through the waveforms of the single- and three-phase power being transferred. The dynamic AC characteristics of the load may be adjusted in order to avoid excessive current spikes, or to take advantage opportunistically, to stabilize the source, or to isolate and protect the appliance from potential problems upstream.

In some embodiments, both active and passing sensing techniques may be used in conjunction, such that sensor arrays 125-1, 125-2, and 125-3 are independently capable of active signal injection for active sensing (e.g., injecting a reference signal at a specific frequency between a pair of conductors, etc.). In one example, a 20 kHz signal is injected between sensor arrays 125-1 and 125-2 and the impedance between the two sensor arrays is measured. During the signal injection, two additional impedance measurements are made: one between sensor arrays 125-1 and 125-3, and one between sensor arrays 125-2 and 125-3. The impedance measurements characterize different aspects of the conductive environment, and can provide diagnostic clues that indicate pre-emergent fault conditions.

A second phase view may be obtained by injecting a 20 kHz signal between sensor arrays 125-1 and 125-3 and measuring the impedance between these two sensor arrays. In this second phase view, additional impedance measurements are made between sensor arrays 125-1 and 125-2, and between sensor arrays 125-2 and 125-3. Similarly, a third phase view may be obtained by injecting a 20 kHz signal between sensor arrays 125-2 and 125-3 and measuring the impedance between these two sensor arrays. In this third phase view, additional impedance measurements are made between sensor arrays 125-1 and 125-2, and between sensor arrays 125-1 and 125-3.

Impedance between sensor array pairs is just one example of a property that can be actively measured (i.e., measured after signal injection). Other examples include Each of the phase views provides data from a different vantage point, and the overlap in viewpoint redundancy can potentially provide both consistency checking and diagnostic capability (e.g., localizing a defect/fault to a particular conductor, or a particular subset of conductors, etc.). For example, a galvanic corrosion-induced fault condition may be visible from only one particular phase view. Suppose, for example, that corrosive contact exists between sensor arrays 125-2 and 125-3. The interface between these two sensor arrays is measured actively in the third phase view, and is measured passively in the first and second phase views. Under normal conditions (i.e., where there are no defects or faults), measurements would be symmetrical across all phase views. Under abnormal conditions, however, local geometry and chemistry, as well as the geometry of a particular defect/fault may create asymmetrical signatures that can detect defects and existing faults, and predict future faults. Further, changes in measurements over time (e.g., changes in the impedance measurements of the first phase view at two different times, changes in the differences between impendence measurements of the first phase view and second phase view at two different times, etc.) may be used to identify rate of corrosion and its undesirable criticality.

In accordance with one embodiment, measurements are logged, and the log may be used to guide subsequent off-line diagnostic analysis. The diagnostic records can be provided for external analysis by a human technician, or may also be analyzed algorithmically. Further, the gain of the preset response may be tuned or otherwise adjusted to better or more quickly respond to observed conditions.

In some embodiments, passive sensing from multiple phase views can be employed, either in conjunction with sensing from multiple phase views, or on its own (i.e., without multiple-phase-view active sensing). For example, in the case of grounded single-phase, three conductors may be sensed thermally, with conductor pairs compared.

It should be noted that the multiple-phase-view technique disclosed above can be performed in a similar fashion when there are four sensors arrays/conductor pairs (e.g., for a three-phase circuit, etc.), or when there is an even greater number of sensors arrays/conductor pairs, both with active sensing and/or passive sensing. It should be noted that in some embodiments, one or more of blocks 602, 603, and 604 may occur within a monitoring loop not depicted in the flow diagram.

At block 605, one or more remedial actions are taken in response to the undesirable state identified at block 604 are identified. Action is taken programmatically to avoid the problem; the information that enabled detection often describes a rich context that has good diagnostic specificity. This diagnostic detail may be useful to inform subsequent remedial actions. Remediation may for example be applied as repairs, maintenance, or replacement. In this case, the diagnostic information from an event is stored with the event record in memory 131, recalled and presented through status device 160 to a user.

Two classes of automatic or programmatic action that may be applied are safety shutoff and modulation. Safety shutoff is invoked when a clear and present hazard is detected, indicating that operation is unsafe. Modulation may be invoked when conditions indicate a developing or impending undesirable condition that is trending away from normal safe operating conditions. This is used to avoid a problem and reverse the observed operating variance, and automatically return to normal operating conditions. It should be noted that not all conditions can be reversed by modulation: for example, corrosion or wear may be beyond the capability of modulation. In these cases, modulation provides a "graceful degradation" to continue operation without necessitating a shutdown. Continued operation even in a degraded state still has high value, especially in high-reliability systems where downtime may be expensive or even catastrophic (e.g., in aircraft and flight systems, etc.). The farthermost modulation extreme may achieve zero or near-zero current, with correspondingly zero power transfer. This case is similar to a safety shutoff, except that conductors 180 & 185 remain energized, and some minimal level of appliance functionality is maintained.

In one embodiment, the modulation is implemented in a power conversion device within load 190, and is performed in response to a signal from monitoring device 110. The power conversion device may be an AC/DC converter that converts the variable line voltage (AC 1-phase or AC 3-phase or DC) to the specific power needs for the load's internal use. This internal need usually includes a DC battery.

In one embodiment, one or more modulation techniques may be employed, such as pulse width modulation (PWM), frequency modulation (FM), phase modulation (PM), amplitude modulation (AM), or some combination thereof. Each of these modulation techniques constitutes a dimension that is described or prescribed parametrically, and may be described as "load quality modulation."

In one embodiment, the particular modulation technique(s) are selected dynamically based on the particular undesirable state that has been detected. In one implementation, sensor data are associated with the undesirable state to prescribe an appropriate modulation technique that is communicated to the power conversion device and performed during power conversion. The system is pre-programmed with a set of modulation responses to respond to particular undesirable states (e.g., the most common undesirable states, etc.). The degree of the modulation response may be determined based on the magnitude of the undesirable state (e.g., a linear relationship between the degree of modulation and a "undesirable state severity scale" from 1 to 10, etc.).

In one embodiment, the system determines whether the undesirable state has been corrected (e.g., transformed into an non-undesirable state, etc.) by the modulation response. If the modulation failed to correct the undesirable state, then a safety shutdown is performed.

A safety shutoff event may require an inspection or other manual supervisory function before permission is given to resume safe operation. It may also require a minimum time interval to allow calming or cool-down before restoring operation. Depending on the nature or severity of the fault condition, an inspection may be required. This may include a manual visual or electrical inspection to verify that no damage has occurred. The inspection process may also be fully automatic, implemented through sensor arrays 125-1, 125-2, 125-3. All sensor arrays are independently operable, and remain fully functional while Electrical Source 170 is offline, and when Electrical Load 190 is off-line. This allows for their autonomous operation for purposes of pre-inspection and safety qualification.

After block 605 has been performed, method 600 terminates. As described above, although a single execution of method 600 is depicted in FIG. 5, the method may be performed multiple times (e.g., a pre-determined number of times, at fixed or variable time intervals; in an infinite loop, etc.).

In one embodiment, method 600 may be performed during a "service session," in which (1) electrical load 190 is connected conductively, (2) power is then transferred or consumed, and (3) electrical load 190 is then disconnected, ending the session. When electrical load 190 is a mobile appliance, its mobility is restored once the session has ended. An example of a power-transfer cycle during a service session is shown in FIG. 9.

In accordance with one embodiment, electrical load 190 is augmented with additional functionality, or "intelligence". In one example, the intelligent load is capable of detecting a second load on the same circuit. Large loads, such as EV charging stations, air conditioners, washers, dryers, electric stoves, etc. are ideally on their own circuit with an appropriately rated breaker. However, this is not always possible due to installation costs, limitations to the panel size, or the home electric service feed. Various hardware solutions have evolved to enable the sharing of the same circuit between loads; however, these solutions can be costly. It would be advantageous if an added load were sufficiently intelligent to detect that it is being used in a shared circuit situation, and in response to this detection, automatically throttle or turn off its own energy use when it detects another load comes online. We disclose such a load (subsequently referred to as a "smart load") below.

In accordance with one embodiment, a smart load continuously monitors the voltage of the circuit to which it is connected. The smart load observes and persists the voltage drop that results from its own operation (original voltage when idle minus new voltage when fully operational). The smart load further observes and persists the temperature increase caused by heat dissipation on the circuit wires supplied by remote sensing.

In one embodiment, the smart load will enter a transitional state whenever a voltage drop of similar magnitude is observed either prior to or during its own operation. The smart load will not permit active operation when the temperature of the wires is elevated, and/or when the temperature of the wires matches previously observed values under load. The smart load will turn off (e.g., in a single step, in successive steps, etc.) and will confirm that the circuit voltage has recovered. It will continue to monitor the heat dissipation on the circuit wires through remote sensing.

The smart load will only resume operation if it registers a voltage increase that matches the previously registered decrease. It will wait until the circuit wires have sufficiently cooled which serves as an additional confirmation that no other load is active.

The smart load thus enables, for example, the addition of a smart EV charger to a dryer circuit. This smart charger would have the capability to detect the presence of another load on the same circuit and modify its own operation to accommodate this load.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. A method comprising:
injecting an electrical signal into an electrical power-transfer system, wherein the electrical power-transfer system comprises an electrical power source, an electrical load, a first sensor, a second sensor, a first conductor, and a second conductor, and wherein the first sensor is electrically coupled to the second sensor and the first conductor, and wherein the second sensor is electrically coupled to the second conductor;
measuring, during or after the injection of the electrical signal, an electrical property between the first sensor and the second sensor to obtain a measurement;
determining that the electrical power-transfer system is in a hazardous state based on the measurement of the electrical property between the first sensor and the second sensor; and
in response to the determining that the electrical power-transfer system is in the hazardous state, performing one or more actions to correct the hazardous state.

2. The method of claim 1 wherein the electrical property is impedance.

3. The method of claim 1 further comprising identifying the first conductor as a cause of the hazardous state based on the measurement.

4. The method of claim 1 wherein the electrical signal is injected between the first sensor and the second sensor.

5. The method of claim 1 wherein the one or more actions comprises modulating current in the electrical power-transfer system.

6. The method of claim 5 wherein the modulating fails to correct the hazardous state, and wherein the one or more actions further comprises a shutoff of power, and wherein the shutoff is in response to the modulating failing to correct the hazardous state.

7. A method comprising:
injecting an electrical signal into an electrical power-transfer system, wherein the electrical power-transfer system comprises an electrical power source, an electrical load, a first sensor, a second sensor, a first conductor, and a second conductor, and wherein the first sensor is electrically coupled to the second sensor and the first conductor, and wherein the second sensor is electrically coupled to the second conductor;
measuring, during or after the injection of the electrical signal, an electrical property at the first sensor to obtain a first measurement and the electrical property at the second sensor to obtain a second measurement;
determining that the electrical power-transfer system is in a hazardous state based on the first measurement and the second measurement; and
in response to the determining that the electrical power-transfer system is in the hazardous state, performing one or more actions to correct the hazardous state.

8. The method of claim 7 wherein the electrical property is voltage.

9. The method of claim 7 wherein the electrical signal is injected in response to a signal transmitted to the electrical power source.

10. The method of claim 7 wherein the one or more actions comprises modulating current in the electrical power-transfer system.

11. A method comprising: injecting a first electrical signal into an electrical power-transfer system, wherein the electrical power-transfer system comprises an electrical power source, an electrical load, a first sensor, a second sensor, a first conductor, and a second conductor, and wherein the first sensor is electrically coupled to the second sensor and the first conductor, and wherein the second sensor is electrically coupled to the second conductor;
measuring, during or after the injection of the first electrical signal, an electrical property between the first sensor and the second sensor to obtain a first measurement;
injecting a second electrical signal into the electrical power-transfer system;
measuring, during or after the injection of the second electrical signal, the electrical property between the first sensor and the second sensor to obtain a second measurement;
determining that the electrical power-transfer system is in a hazardous state based on the first measurement and the second measurement; and
in response to the determining that the electrical power-transfer system is in the hazardous state, performing one or more actions to correct the hazardous state.

12. The method of claim 11 wherein the electrical property is DC resistance.

13. The method of claim 11 further comprising selecting one of the first conductor or the second conductor as a cause of the hazardous state based on at least one of the first measurement or the second measurement.

14. The method of claim 11 wherein at least one of the first electrical signal or the second electrical signal are injected between the first sensor and the second sensor.

15. The method of claim 11 wherein the one or more actions comprises modulating current in the electrical power-transfer system.

16. The method of claim 11 further comprising estimating a rate of corrosion based on the first measurement and the second measurement.

17. A method for detecting and handling a suboptimal state of an electrical power-transfer system, wherein the electrical power-transfer system comprises an electrical power source, an electrical load, a first sensor, a second sensor, a first conductor, and a second conductor, and wherein the first sensor is electrically coupled to the second sensor and the first conductor, and wherein the second sensor is electrically coupled to the second conductor, and wherein the method comprises:

measuring, by the first sensor, an environmental property to obtain a first measurement;

measuring, by the second sensor, the environmental property to obtain a second measurement;

determining that the electrical power-transfer system is in the suboptimal state based on the first measurement and the second measurement;

in response to the determining that the electrical power-transfer system is in the suboptimal state, performing one or more actions to correct the suboptimal state.

18. The method of claim 17 wherein the suboptimal state is one of overload or underload.

19. The method of claim 17 further comprising identifying the first conductor as a cause of the suboptimal state based on at least one of the first measurement or the second measurement.

20. The method of claim 17 wherein the environmental property is one of temperature, humidity, or pressure.

21. The method of claim 17 wherein the one or more actions comprises modulating current in the electrical power-transfer system.

* * * * *